United States Patent [19]

Nagata et al.

[11] 4,171,234
[45] Oct. 16, 1979

[54] METHOD OF FABRICATING THREE-DIMENSIONAL EPITAXIAL LAYERS UTILIZING MOLECULAR BEAMS OF VARIED ANGLES

[75] Inventors: Seiichi Nagata, Sakai; Tsuneo Tanaka; Masakazu Fukai, both of Nishinomiya, all of Japan

[73] Assignee: Matsushita Electric Industrial Co., Ltd., Osaka, Japan

[21] Appl. No.: 815,303

[22] Filed: Jul. 13, 1977

[30] Foreign Application Priority Data

Jul. 20, 1976 [JP] Japan ................... 51-86736
Sep. 30, 1976 [JP] Japan ................... 51-118126

[51] Int. Cl.$^2$ ............... H01L 21/203; H01L 29/06
[52] U.S. Cl. ............................... 148/175; 29/579;
29/580; 148/1.5; 156/612; 156/647; 156/649;
357/16; 357/17; 357/55; 357/56; 357/60
[58] Field of Search ............... 148/175, 1.5; 29/579,
29/580; 156/602, 647, 649; 357/16, 55, 56, 60

[56] References Cited

U.S. PATENT DOCUMENTS

| 3,865,625 | 2/1975 | Cho et al. .......... 148/175 X |
| 3,906,541 | 9/1975 | Goronkin ............. 357/22 |
| 4,099,305 | 7/1978 | Cho et al. .......... 29/579 |

OTHER PUBLICATIONS

Ilegems et al., "Epitaxial Growth . . . GaAs Injection Lasers", J. Crystal Growth, 31, 1975, pp. 158–164.
Tsang et al., "Profile . . . Chemical Etching . . . System", Applied Physics Letters, vol. 28, No. 1, Jan. 1976, pp. 44–46.
Ludeke et al., "Fabrication . . . Injection Laser", IBM Tech. Discl. Bull., vol. 15, No. 2, Jul. 1972, pp. 546–547.
Chang et al., "Fabrication for Multilayer Semiconductor Devices", Ibid., vol. 15, No. 2, Jul. 1972, pp. 365–366.
Dumke et al., "GaAs Field-Effect . . . Gates", IBM Tech. Discl. Bull., vol. 14, No. 4, Sep. 1971, pp. 1248–1249.
Merz et al., "Tapered Couplers . . . Molecular Beam Epitaxy", Applied Physics Letters, vol. 26, No. 6, Mar. 15, 1975, pp. 337–340.
Nagata et al., "Self-Masking . . . Molecular-Beam Method", J. Applied Physics, vol. 48, No. 3, Mar. 1977, pp. 940–942.

Primary Examiner—L. Dewayne Rutledge
Assistant Examiner—W. G. Saba
Attorney, Agent, or Firm—Burgess, Ryan and Wayne

[57] ABSTRACT

Three-dimensional structures having a suitable geometrical configuration are directly formed on one major surface of a substrate so that an epitaxial molecular beam may be incident on preselected regions, and the angles of incidence of epitaxial molecular beams are varied. As a result the arrival rates of molecular beams are varied from one region to another on the substrate so that a three-dimensional epitaxial layer in which the physical properties are different from one region of a submicron across to another may be grown.

26 Claims, 24 Drawing Figures

FIG. 1
FIG. 2
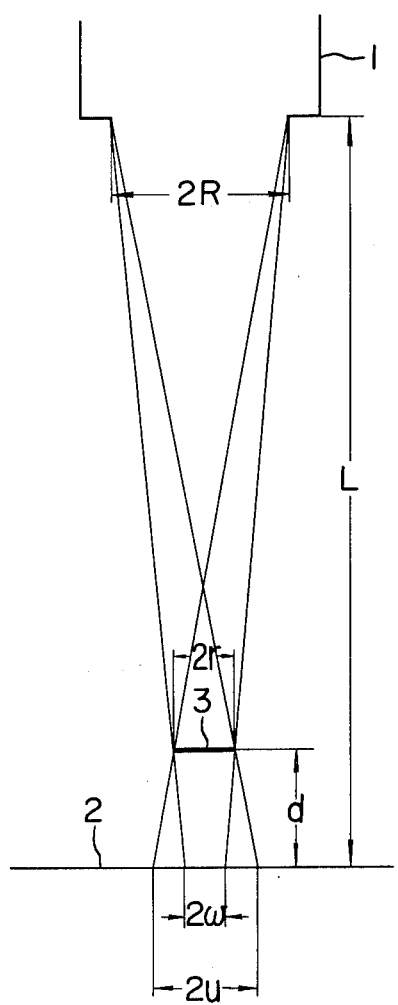
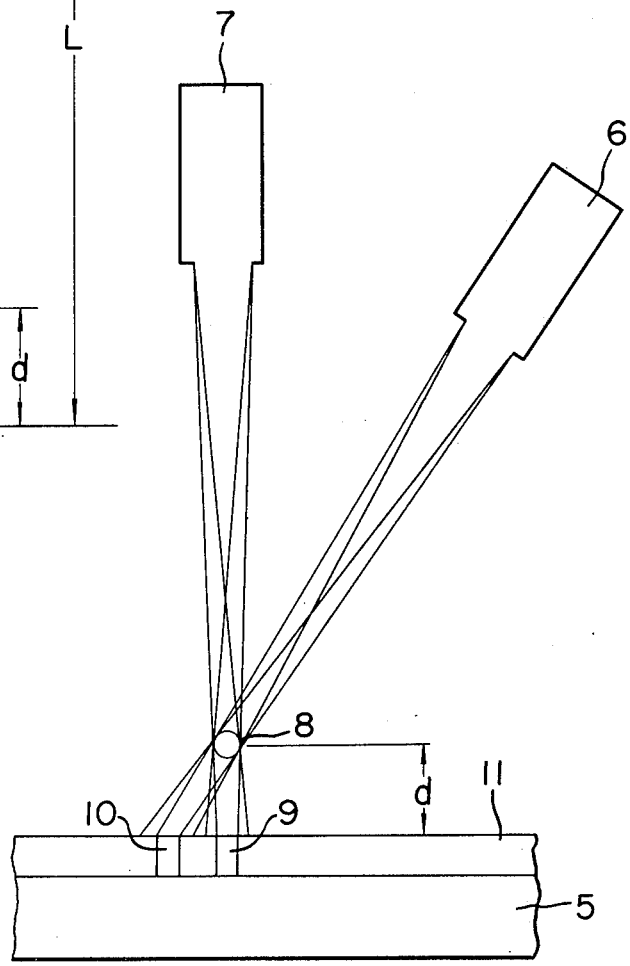

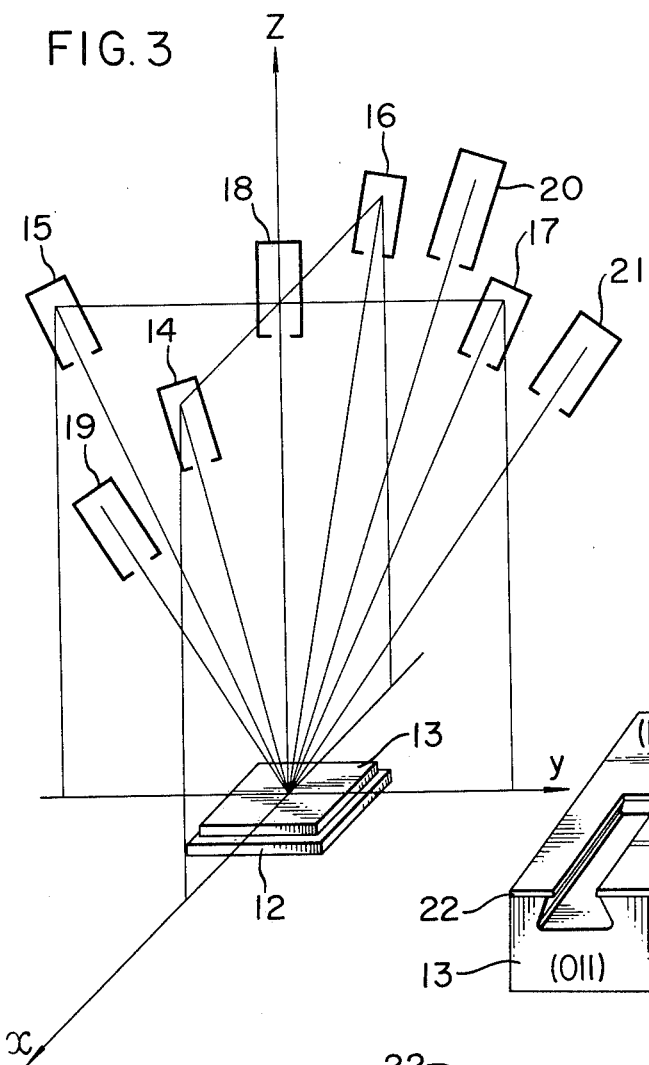
FIG. 3
FIG. 4a
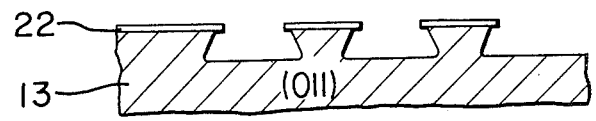
FIG. 4b
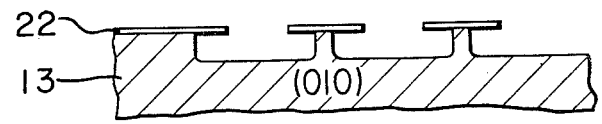
FIG. 4c
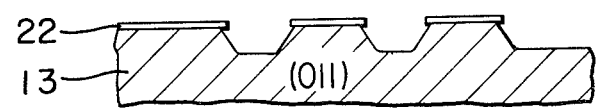
FIG. 4d

|←——— 88 μ ———→|

|←— 1 μ —→|

METHOD OF FABRICATING THREE-DIMENSIONAL EPITAXIAL LAYERS UTILIZING MOLECULAR BEAMS OF VARIED ANGLES

BACKGROUND OF THE INVENTION

The present invention relates to a crystal growing method based on an improved molecular beam epitaxy and single crystal devices fabricated by this method.

In the so-called communications age, the volume of information and data to be exchanged and processed is increasingly growing so that high-capacity and high-speed communication systems and data processing systems have been demanded. To this end, there have been increasingly strong demands for electronic components capable of satisfactorily functioning in SHF band, and optical devices and integrated optical circuits for optical communication and data processing systems. In order to fabricate these electronic and optical components there has been a strong demand for a novel process for growing high quality crystals having multi-dimensional distributions of components and impurity concentration, the distributions being controlled in the order of submicrons.

The conventional selective epitaxy is such that a crystal face of a substrate is masked with a film different chemically and physically from the substrate and having a suitable aperture pattern so that desired crystals may be grown on uncovered regions of the substrate. In order to epitaxially grow crystals having a multi-dimensional structure without the use of a mask, there has been invented and demonstrated a process utilizing a beam of ions, but so far high-quality crystals adapted for the fabrications of electronic devices has not been produced yet because the controls of ion beam convergence, deflection and decleration are difficult and because the atmosphere in a crystal growing container cannot be maintained free from contamination.

In the liquid and gas phase epitaxy based on the thermal equilibrium wherein the crystal growth is effected by the repeated exchanges of atoms and molecules between the surface of crystal growth and a means for supplying these atoms and molecules or materials, it is meaningless to control the direction of incidence of these atoms and molecules on the substrate. However, in the molecular beam and thermal decomposition epitaxy, the material atoms and molecules are transported only in one direction from supply means to a substrate. Therefore when the mean free path (l) of the molecules is made sufficiently longer than the source-to-substrate distance (L), it is possible to control the angles of incidence of epitaxial molecular beams. A solid angle $\Omega$ at a point on a substrate subtended by an aperture with an area S of supply means or beam source is given by $$\Omega = S/L^2$$

When $l >> L$ and $\Omega = 0$, a molecular beam from the beam source may be regarded as a parallel beam so that it may be so controlled as to be incident upon the substrate at a predetermined angle. In this molecular beam and thermal decomposition epitaxy wherein the epitaxial growth is effected at a sufficiently reduced pressure, the solid angle $\Omega$ may be made sufficiently small by the geometrical arrangement of a crystal growing apparatus.

SUMMARY OF THE INVENTION

One of the objects of the present invention is therefore to provide an extremely simple crystal growing method which may epitaxially grow crystals without the use of masking means and an extremely fine beam such as an ion beam used in the ion beam process, the crystals having a multi-dimensional structure and being dimensionally controlled in the order of submicrons.

Another object of the present invention is to provide semiconductor devices having novel structures hitherto unattainable by the prior art.

To the above and other ends according to the present invention in the molecular beam and thermal decomposition epitaxy essentially not based on the thermal equilibrium beams of molecules of materials for epitaxial crystal growth are transported only in one direction from beam sources to one major surface of a substrate, and the inventors found out that the angles of incidence of these beams may be controlled if the mean free path (l) of molecules is sufficiently made longer than a source-to-substrate distance (L). Three-dimensional structures having a suitable geometrical configuration for attaining desired selective epitaxial growth are formed on the substrate so that the local arrival rates of molecular beams are dependent on the positions and angles relative to the substrate of the molecular beam sources and on the geometrical configuration of the three-dimensional structure. As a result, the arrival rates of molecular beams vary from one region to another on the substrate. That is, if the surface diffusion of the molecules stuck to the substrates or the surface of crystal grown is shorter as compared with the size of the three-dimensional structures, the crystal growth rate at one local region is dependent upon the arrival rates of molecular beams. Thus the selective epitaxy may be accomplished. The inventors also found out that the composition of mixed crystals and the concentration of an impurity or dopant may be suitably controlled by a suitable arrangement of molecular beam sources. Thus the epitaxial crystal growth can be so effected that the thickness of a crystal layer or film, the composition of mixed crystals, the concentration of an impurity and so on are multi-dimensionally controlled in regions of submicrons across, and consequently improved and novel single crystal devices can be fabricated.

BRIEF DESCRIPTION OF THE DRAWINGS

FIG. 1 is a diagrammatic view used for the explanation of the formation of an umbra and a penumbra by a shielding or screening member placed in the path of a diverging molecular beam emitted from a beam source;

FIG. 2 is a diagrammatic view used for the explanation of the prior art selective epitaxy;

FIG. 3 is a diagrammatic view showing an arrangement of a substrate and a plurality of molecular beam sources used in the present invention;

FIG. 4 shows the configurations of recesses or grooves etched in a (100) major surface of a GaAs substrate;

DESCRIPTION OF THE PREFERRED EMBODIMENTS

Figure 5:
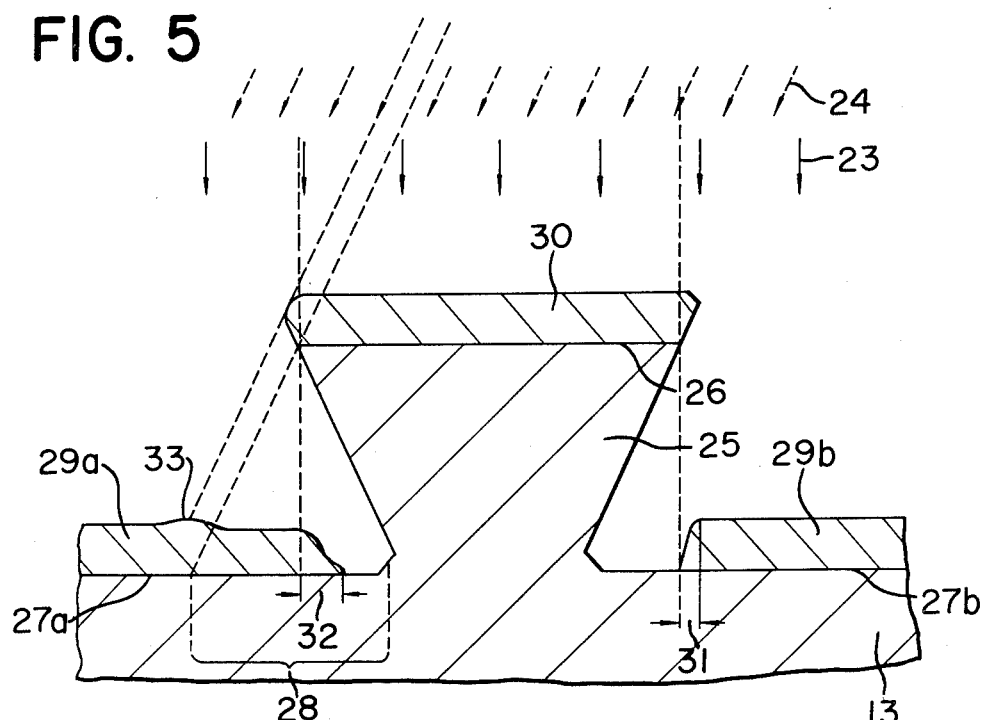
FIG. 5 is a schematic view of a first embodiment of a single crystal device in accordance with the present invention.

The present invention may be carried out by a method for transporting molecules in one way at such a reduced pressure that the mean free path l of the molecules is sufficiently longer than the source-to-substrate distance L, and no special limitations are imposed on epitaxy means, crystals and materials of substrates and so on. In order to help understanding of the underlying principles of the present invention, it will be described in conjunction with a prior art method for growing GaAs, $Ga_{1-x}Al_xAs$ and $GaAs_{1-y}P_y$ crystals by molecular beam epitaxy.

First referring to FIGS. 1 and 2, an example of selective epitaxy utilizing the nature of a molecular beam traveling a straight path will be described. A diverging molecular beam is emitted from a source 1 with a predetermined aperture 2R onto a substrate 2, and a shielding or screen disk with a diameter 2r is placed in the path of the molecular beam so that an umbra with a width 2W and a penumbra with a width 2u are formed. By simple geometric analyses, we obtain $$(R-w)/L=(R-r)/(L-d) \quad (1)$$

$$(R+u)/L=(R+r)/(L-d) \quad (2)$$

where
L=the source-to-substrate distance, and
d=the distance between the substrate 2 and the shielding disk 3.

Rewriting Eqs. (1) and (2), we have $$w = r(1 - \frac{R}{r} \cdot \frac{d}{L})/(1 - d/L) \quad (3)$$

$$u = r(1 + \frac{R}{r} \cdot \frac{d}{L})/(1 - d/L) \quad (4)$$

The molecules emitted from the source 1 impinge against the substrate at an area not shadowed by the shielding disk 3 with a uniform probability, but they will not impinge on the umbra area. A number of molecules, impinging the penumbra area is dependent upon the conditions of this penumbra. As a result, the rate of crystal growth is dependent upon the local arrival rate of molecules so that selective crystal growth may be effected in the area except the umbra region. The values w and u may be arbitarily reduced by suitably selecting other geometrical parameters.

FIG. 2 shows the underlying principle of the selective epitaxial growth based on the principle described in conjunction with FIG. 1, this method being disclosed in U.S. Pat. No. 3,865,625 granted to A. Y. Cho et al. and Appl. Phys. Letters 21, 355 (1972). A first beam source 6 emits the beam of Ga and $As_2$ molecules while a second beam source 7, the beam of Al molecules. A fine tungsten wire 8 is placed in the paths of the beam of Ga and $As_2$ (to be referred to as "a first beam") and the beam of Al molecules (to be referred to as "a second beam") so that only the first beam impinges a region 9 shadowed by the wire 10 and only the second beam impinges at a region 9. Thus selectively formed within an epitaxial layer 11 are regions wherein x of the compositions of $Ga_{1-x}Al_xAs$ is different.

M. Ilegems et al. reported in the Journal of Crystal Growth; 31 (1975) 158 a method wherein a three-dimensional structure is formed upon substrate crystals and then mixed crystals of $Ga_{1-x}Al_xAs$ are uniformly grown by molecular beam epitaxy, but they did not report the analyses of epitaxial growth and grown layers and did not suggest at all how a crystal layer having a three-dimensional structure may be grown.

Because the shielding or masking disk consists of a tungsten wire which is chemically and physically different from the first and second beams and the substrate, the following problems arise:

(i) In order to define the selected region 9 with a width ranging from a few microns to tens of microns, the masking means 8 must be linear.

(ii) As a result, there must be provided means for securely supporting a fine wire like masking means above the substrate so that the selected region 9 inevitably extends from one side of the substrate to the opposite side. Therefore it becomes impossible to define the ends of the selected region 9 on the substrate.

(iii) Assume that the width 2w of the selected regions be made smaller than the width 2r of the masking means. However when a plurality of selected regions are arranged in parallel, their minimum pitch is limited by 2r. In other words, the parallel selected regions cannot be defined with a pitch smaller than minimum pitch which is limited by 2r.

(iv) In order to more exactly control the selected regions having a width smaller than the masking means 3 or 8, the distance d between the masking means and the substrate must be controlled with a higher degree of accuracy, but in practice this is extremely difficult.

(v) When the selected region 9 must be formed at a preselected region of the substrate, the correct registration between the substrate and the masking means is required.

Therefore it would be extremely difficult or next to impossible to provide a device based on the prior art principle for the manufacture of semiconductive devices having selected regions of the order of microns and submicrons. In addition, in the epitaxial growth, the substrate must be heated so that the difference in thermal expansion coefficient between the substrate and the masking means must be further taken into consideration. Thus the difficulties are further enhanced.

These problems may be attributed to the use of the masking means which is chemically and physically different from the substrate. In order to solve these problems, the inventors conducted extensive studies and experiments and found out that all of the problems described above may be substantially solved by forming or growing a three-dimensional structure directly upon a substrate so that this structure may serve as a masking means. Thus effects hitherto unattainable by the prior art can be obtained, and the self-aligning, selective epitaxial growth may be effected with a higher degree of accuracy in the order of submicrons.

So far the above underlying principle of the present invention has not been disclosed in any patents and other references pertaining to the molecular beam epitaxy and the thermal decomposition methods, but reference is made to the following publications pertaining to the molecular beam epitaxy:

(i) U.S. Pat. No. 3,615,931, granted to J. R. Arthur
This patent first discloses the fundamental idea of molecular beam epitaxy.
(ii) J. Vac Sci and Technol 6 (1969) 545, J. R. Arthur et al.
(iii) Solid State Comm. 9 (1971) 565, A. Y. Cho et al.
Reference (ii) discloses the growth of $GaAs_{1-y}P_y$ mixed crystals while Reference (iii), the growth of $Ga_{1-x}Al_xAs$ mixed crystals.
(iv) U.S. Pat. No. 3,751,310, granted to A. Y. Cho.
(v) U.S. Pat. No. 3,839,084, granted to A. Y. Cho et al.
(vi) J Vac Sci and Technol, 8 (1971) S31, A. Y. Cho.
Reference (iv) discloses doping characteristics of Ge; Reference (v), those of Mg; and Reference (vi), those of Ge, Mg and Sn.
(vii) Laid-Opened Patent No. 48-98775, NISHIDA Katsuhiko et al.
(viii) Appl Phys Letters 27 (1975), 342, M. Naganuma et al.
References (vii) and (viii) discloses a doping method utilizing a beam of ions.
References (i) through (vi) pertain to the molecular beam epitaxial growth on a flat substrate, but do not discuss in detail the property that the beam of molecules travels a straight path.
(ix) U.S. Pat. No. 3,865,625, granted to A. Y. Cho et al, and Apply. Phys. Letters 26 (1975) 337, J. L. Merz et al.
These references discuss the property that the beam of molecules travels a straight path, and teach to place a molecular beam masking means made of a material different from a substrate, the masking means being spaced apart from the substrate.
(x) J. Crystal growth 31 (1975) 158, M. Ilegems et al.
This reference discloses the molecular beam epitaxial growth on a substrate which is similar in structure to a substrate to be described in detail in conjunction with EXAMPLE 9 of the present invention, but does not teach or suggest any parts of the underlying principle of the present invention and any analyses concerning the present invention.

The difference between the underlying principle of the present invention and the ideas disclosed in the above references will become more apparent from the following description of the preferred embodiments thereof.

In FIG. 3 there is shown a first preferred embodiment of an apparatus for carrying out a molecular beam epitaxial growth process in accordance with the present invention. A substrate holder 12 whose temperature may be controlled is rotatable through $\pm 180°$ about the z-axis, and a GaAs substrate 13 which is prepared in a manner to be described hereinafter is placed on the holder 12 with a layer of liquefied metal sandwiched therebetween. Each of beam sources 14 through 21 is made of high-purity, heat-resisting material and contains a high purity material. They are temperature controlled independently of each other, and each emits a beam of molecules to the major surface of the substrate 13, the intensity of the beam being in proportion to the vapor pressure of the material contained in the source. The beam sources 14 through 21 have circular apertures having the same diameter of 6 mm, and are spaced apart from the substrate by a distance $L=8$ cm. The Ga beam source 14 and the Al beam source 16 are disposed in the x-z plane while the As beam sources 15 and 17, in the y-z plane. All of these beam sources 14, 15, 16 and 17 are inclined at 25° relative to the z-axis. The beam source 18 is disposed on the z-axis; the beam sources 19 and 20, in the x-z plane; and the beam source 21, in the y-z plane. The beam sources 19, 20 and 21 are inclined at 35° relative to the z-axis. The positions of the beam sources 14 through 21 are interchangeable, and these beam sources may emit beams of different molecules. Except for the As beam source 17, the remaining beam sources are provided with shutters (not shown) actuable independently of each other. The substrate holder 12, the substrate 13 placed thereon, the beam sources 14 through 21 and their shutters are all enclosed in an ultra-high vacuum container which may be evacuated to a pressure less than $5 \times 10^{-10}$ torr.

Referring to FIG. 4, when the (100) GaAs substrate 12 is masked with a photoresist 22 and etched with a conventional preferential etchant ($H_2SO_4:H_2O_2:H_2O=1:8:1$), recesses or grooves having different cross sectional configurations or undercuts are formed, the difference in undercut being dependent upon the direction of the photoresist mask 22 as best shown in FIG. 4(a). The cross sectional configurations of these recesses or grooves are also different from each other depending upon the faces as shown in FIGS. 4(b), (c) and (d).

EXAMPLE 1

A Si-doped, n-type GaAs substrate 13 of $1 \times 1$ cm square was prepared which has a mirror-polished (100) major surface with four sides consisting of (110) cleavage faces. The substrate was masked with photoresist strips of about 10 microns in width and oriented in the $<01\bar{1}>$ direction within a tolerance of less than 30 sec. of arc, and then etched about 5 microns in depth with the etchant described above. After the photoresist had been removed, the whole major surface was etched with the same etchant for about five seconds, washed and dried. Immediately thereafter, the substrate 13 was placed on the holder 12 in such a manner that the direction $<01\bar{1}>$ of the substrate 13 is in parallel with the x-axis (See FIG. 3).

The vacuum container was evacuated to less than $5 \times 10^{-10}$ torr, and thereafter the As beam source 17 was heated to emit $As_4$ molecules on the major surface of the substrate 13 etched as shown in FIG. 4 while the substrate 13 was maintained at 610° C. for ten minutes, thereby effecting thermal etching. Thereafter the substrate 13 was maintained at 550° C., and the shutter of the Ga beam source 14 which had been preheated was opened to emit the beam of $Ga_4$ molecules on the substrate 13 while the Ga beam 23 from the Ga beam source 23 and the $As_4$ beam 24 from the beam source are made impinged on the substrate so that GaAs crystals were grown to 0.84 microns.

FIG. 5 is a $(01\bar{1})$ cross section of an epitaxially grown layer with a structure 25, the beam directions being indicated by arrows. As described above, the direction <01̄1> of the substrate was in parallel with the x-axis so that in the y-z cross section; that is, in the <01̄1> cross section the As$_4$ beam 24 is incident on the substrate at 25° from the upper right while the incidence angle of the Ga beam 23 is perpendicular or normal. As a result, the As$_4$ beam 24 having a sufficient intensity is directly incident upon the top surface 26 of the structure 25 and on the right side surface thereof, but the As$_4$ beam will not be directly incident on the right side region 28 of the undersurface 27a. The Ga beam is uniformly incident on the regions 27a and 27b which are not shadowed by the structure 25 and on the top 25 of the structure 25.

Meanwhile, in the conventional molecular beam epitaxial process with GaAs beams on a flat substrate, the sticking coefficient of Ga is almost unity, and of the incident As$_4$ molecules only those reacted with Ga adhere to the substrate while the remaining As$_4$ molecules are scattered away from the substrate. Therefore when the As$_4$ beam 24 is sufficiently higher in intensity than the Ga beam 23, GaAs crystals stoichiometrically grow in proportion to the local arrival rates of the Ga beam. It has been well known in the art that when the crystal growth continues for a long time with insufficient supply of As$_4$ molecules, Ga liquid drops are formed on the surface. The inventors have confirmed that the region on which is directly incident the As$_4$ beam 24 is supplied with excess As$_4$ molecules. This was confirmed by the illumination of the crystal growing surface with the diffraction electron beam in the x-axis direction in FIG. 3.

Figure 6:
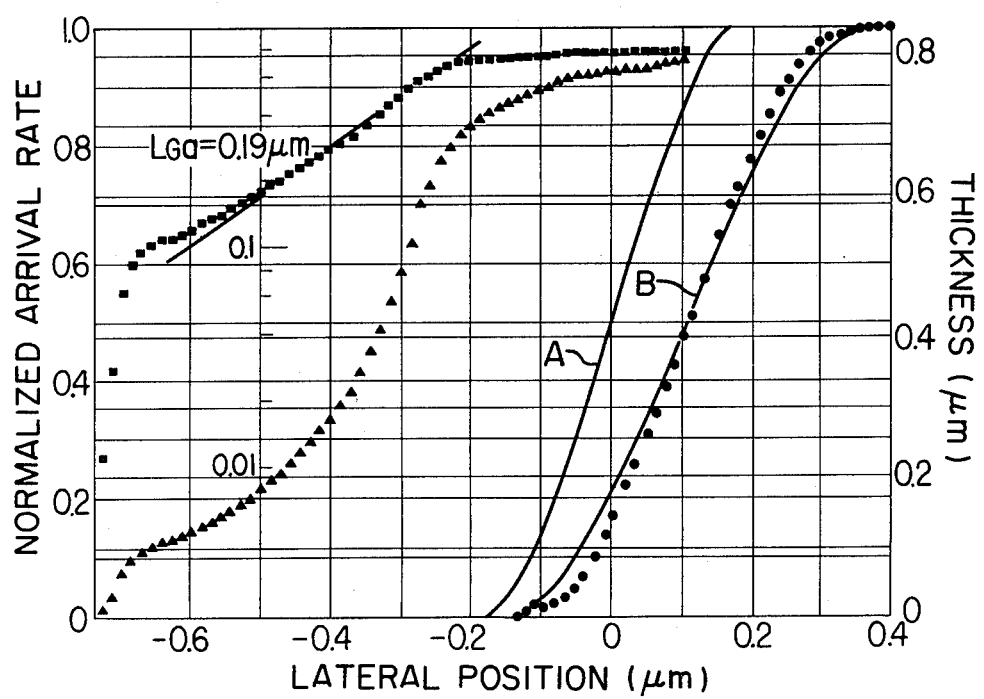
FIG. 6 is a graph used for the explanation of the edge profiles of the single crystal device shown in FIG. 5.

When the molecular beam epitaxy is continued under the above conditions, crystal layers 29a, 29b and 30 are grown. The molecular epitaxial growth will be described in more detail with further reference to FIG. 6. In FIG. 6, the left edge 31 of the layer 29b is indicated by black dots (•). In order to make theoretical analysis of the configuration of the edge 31, it is assumed that (I) the Ga beam is uniformly emitted through the aperture with an area S of the Ga beam source; and (II) at the presence of excess As the surface diffustion length of Ga adhered to the surface of grown crystal layer is negligible.

Figure 7:
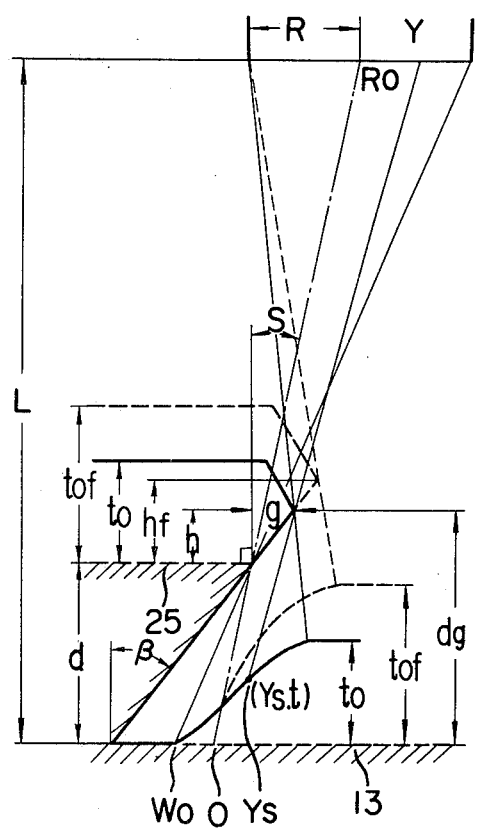
FIG. 7 is a view used for the theoretical analyses of the edge profiles of the single crystal device shown in FIG. 5.

Referring further to FIG. 7, the arrival rate of Ga molecules from the Ga beam source at a point (ys, t) is in proportion to an area Sy of the aperture of the Ga beam source when viewed from the point (ys, t), the line of sight being restricted by the upper edge of the inverted-mesa shaped structure 25. Therefore we have $$Sy = \int_r^{R+R_0} \sqrt{R^2 + (Y-R_o)^2} \, dy \quad (5)$$

where
$Y = [L(d \tan \theta + g - ys)t(d \tan \theta + g) + ys \, dg]/(dg-t)$,
$R_o = L \tan \theta$
$dg = d + h$, and
$\theta$ = the incidence angle of the Ga beam.
The epitaxial layer 30 grows as fast as the layer 29b so that the former expands outwardly, forming an overhang g.

$g = h \tan \beta = h_f \text{to} \tan \beta/\text{tof}$ $\beta$ is called the inverted mesa angle and is 22.5°. When the growth of the overhang g is taken into consideration in the theoretical calculation of the profile of the edge 31, the curve B is obtained as shown in FIG. 6. The curve A indicates the edge profile when the growth of the overhang g is not taken into consideration. The real edge profile indicated by the black dots is very similar to the theoretical curve B with very small errors of ±200 Å. Thus it is verified that the assumption (I) is right.

In FIG. 6, the profile of the right side edge 32 of the layer 29 (See FIG. 5) is also indicated by small black triangles. The curve has a very gentle slope. It is assumed that individual Ga atoms diffuse into the surface of the substrate and that the lifetime of each Ga atom prior to the combination with As is $\tau$. Then the profile of the edge 32 may be theoretically expressed by $\exp(-y/L_{Ga})$ where $L_{Ga} = D_{Ga}$, $\tau$ and $L_{Ga}$ and $D_{Ga}$ are a diffusion length and a diffusion coefficient, respectively.

In FIG. 6 the profile of the right edge of the layer 29a is semilogarithmically plotted with small black squares, and $L_{Ga} = 0.19 \pm 0.04$ microns is obtained from a straight line drawn along this curve. As described above, the region 28 (See FIG. 5) is not bombarded with the primary As$_4$ beam so that the crystals grow under Ga rich condition. Thus the effects of diffusion are sufficiently discernible.

From the above fundamental experiments or Example 1 we found out the following facts; (1) under As rich condition, the diffusion length of Ga is extremely short so that the local growth rate of the GaAs epitaxial layer is in proportion to the local arrival rate of Ga; (2) the surface diffusion length of Ga may be controlled by changing the arrival rate of As$_4$ so that it is possible to extend the epitaxial growth in a region not bombared with Ga atoms; (3) a single crystal can be grown even under Ga rich condition without forming Ga liquid drops if a Ga rich region is localized.

EXAMPLE 2

Figure 8A:
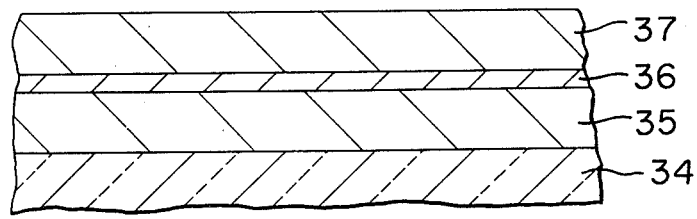
FIGS. 8(a), (b) and (c) are views used for the explanation of the fabrication steps of a second embodiment of the present invention.
Figure 8B:
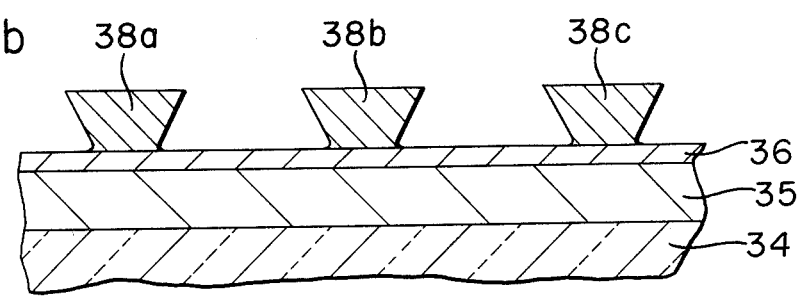
Figure 8C:
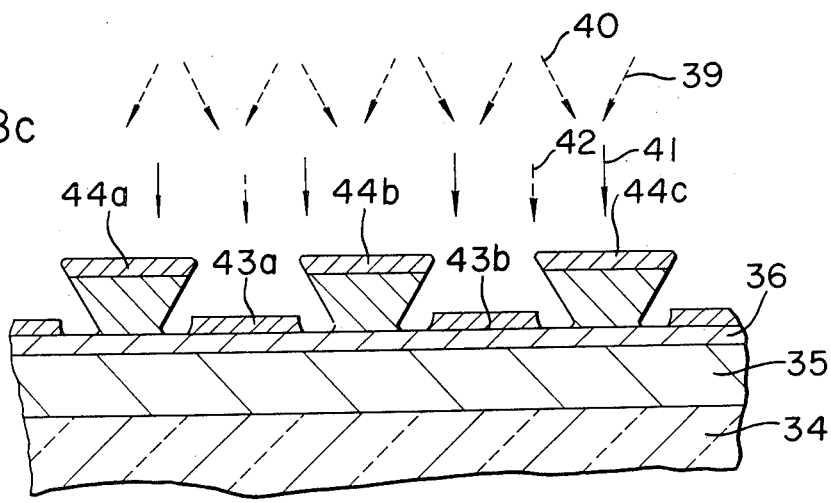

As shown in FIG. 8, following the procedures of Example 1 a semi-insulative GaAs substrate 34 with a (100) major surface was prepared, and by using the conventional methods a p-type layer 35, 3 microns in thickness with the hole concentration of about $5 \times 10^{14}$ cm$^{-3}$ was formed on the substrate 34. Formed over the p-type layer 35 was an n-type layer 36, 0.5 micron in thickness with the electron concentration of about $5 \times 10^{16}$ cm$^{-3}$, and formed over the n-type layer 36 was a p-type layer 37, 3 microns in thickness with the concentration of holes of $1 \times 10^{18}$ cm$^{-3}$. Following the procedures of Example 1 the p-type layer 37 was etched to expose the n-type layer (See FIG. 8b). Thus prepared substrate 34 was placed on the holder (See FIG. 3) in a manner substantially similar to that described in Example 1, and thereafter the As beam sources 15 and 17 were heated to emit sufficient As$_4$ molecules 39 and 40 on the heated substrate for effecting thermal etching. Thereafter, the shutters of the Ga beam sources 14 and Ge beam source 16 which had been preheated were opened to cause the Ga 41 and Ge 42 beams to impinge on the substrate to grow n+ epitaxial layers 43a, 43b, 44a, 44b, 44c and so on, each having the thickness of one micron and being added with $1 \times 10^{18}$ cm$^{-3}$ of Ge. Since the As$_4$ beams sufficiently impinge from both right and left sides of inverted-mesa shaped structures 38a, 38b and 38c, the epitaxial layers are symmetrically grown on both sides of each structure 38 and are free from the abnormal growth which tends to occur at the left side of the structure 38.

EXAMPLE 3

Figure 9:
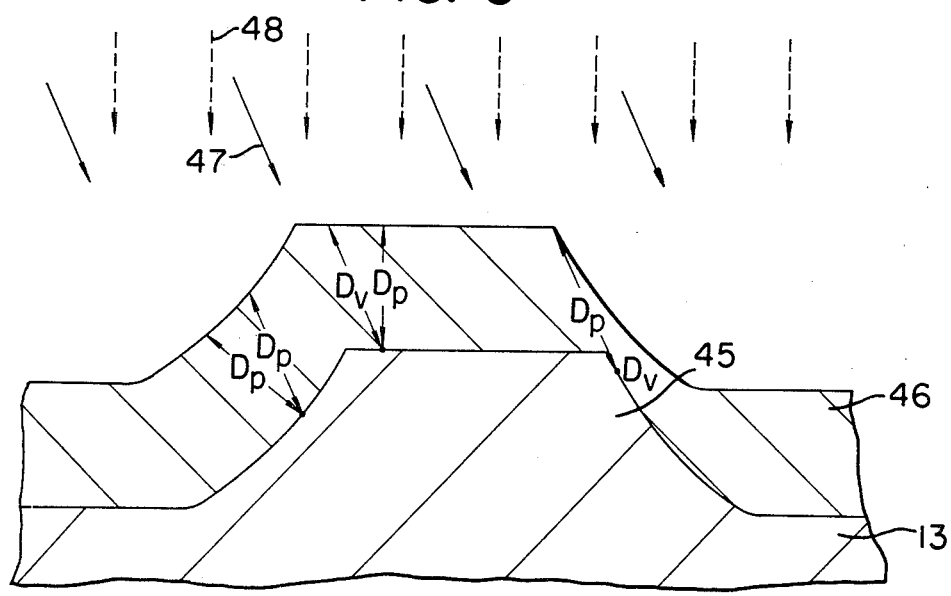
FIG. 9 is a schematic view, on enlarged scale, of a third embodiment of the present invention.
Figure 10:
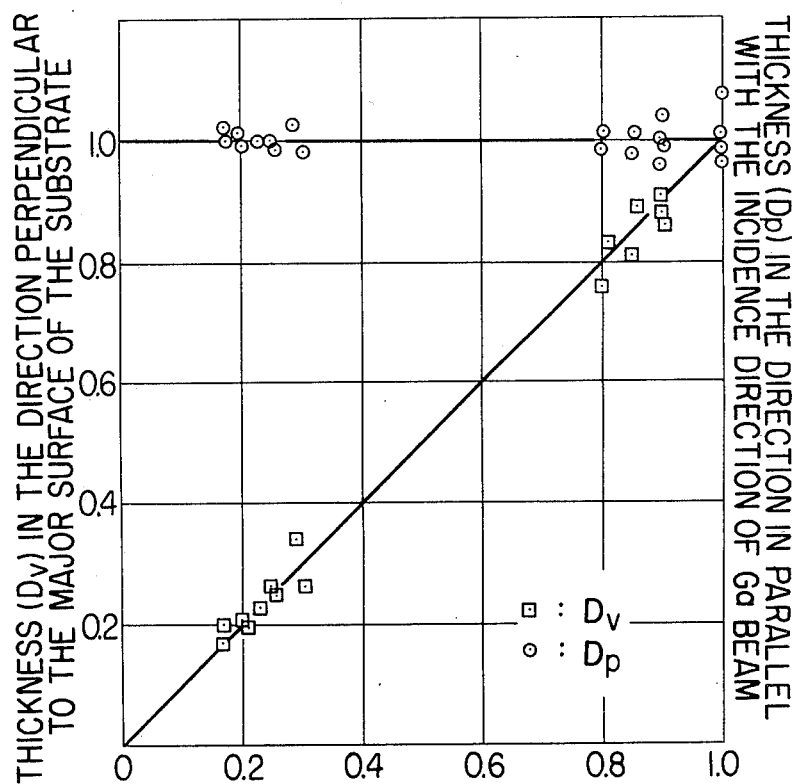
FIG. 10 is a graph used for the explanation of the analysis of the single crystal device shown in FIG. 9.

Example 3 will prove the fact that the local GaAs epitaxial growth rate is in proportion to the local arrival rate of Ga. Following the procedures of Example 1, the mesa type structures were formed as shown in FIG. 4(d), and after the photoresist had been stripped off, the substrate was placed on the substrate holder with the <011> mesa direction in parallel with the y-axis. The substrate was maintained at 600° C., and the GaAs epitaxial growth was effected only with the Ga beam source 14 and As beam sources 15 and 17. In order to eliminate the Ga diffusion effects, As rich condition was kept during the whole epitaxial growth. After the cleavage along the (011) face, the substrate was subjected to stain etching so that the boundary between an epitaxial layer 46 and the substrate 13 may be clearly seen as shown in FIG. 9. In FIG. 9 the Ga and As$_4$ beams 47 and 48 are indicated by the solid-line arrows and the broken-line arrows, respectively. Thickness Dv and Dp at arbitarily selected points of the epitaxial layer 46 are plotted in FIG. 10, the thickness Dv being measured in the direction perpendicular to the major surface of the substrate 13 while the thickness Dp, in the direction in parallel with the incidence direction of the Ga beam. The angle $\phi$ is an angle between the direction of incident Ga beam and the vertical of the major surface of the substrate 13. From FIG. 10 it is seen that the depth Dv is in proportion to cos $\phi$ while the depth Dp is same at various points. This means that the GaAs crystal growth is in proportion to the local arrival rates of Ga beam which in turn are dependent upon the profile of the mesa structure and the incidence angles of Ga beam. In addition, the fact the thickness Dp is same throughout the epitaxial layer 46 means that in a projection plane there exists a projected line (extending in the direction of the direction of incidence of Ga beam) which indicates that the concentration of Ga in a unit area is constant.

EXAMPLE 4

It has been well known in the art that in the molecular beam epitaxity with semiconductors in Groups III and V, the sticking coefficient of the atoms in the III group is almost equal to unity. Therefore the results obtained in Example 3 may be applied to the growth of mixed crystals of atoms in the III group such as Ga$_{1-x}$Al$_x$As in order to epitaxially grow three-dimensional structures.

Figure 11:
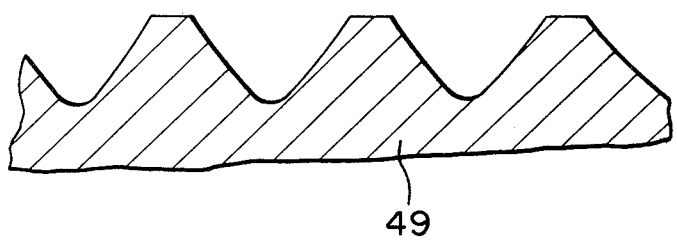
FIGS. 11(a) and (b) are schematic views used for the explanation of the fabrication steps of a fourth embodiment of the present invention.
Figure 11:
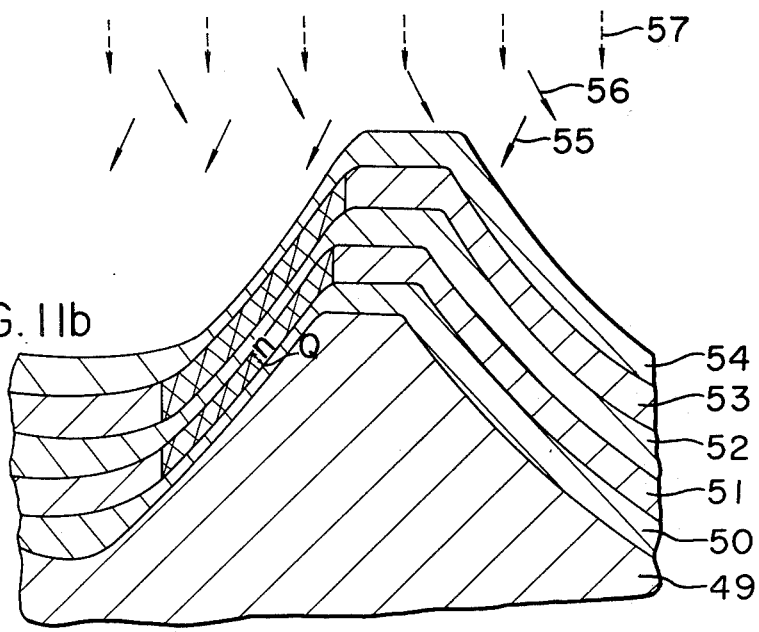

Following the procedures of Example 3, formed upon the (100) major surface of a GaAs substrate are a pattern of photoresist strips with a pitch of 8 microns in parallel with <011> direction and oriented in the <01$\bar{1}$> direction. Thereafter, following the procedures of Example 1, the substrate was subjected to etching. FIG. 11 shows a (011) cross section of thus treated substrate 49 formed with valleys and ridges. The substrate was placed on the substrate holder with the <011> direction in parallel with the y-axis (See FIG. 3). The As beam sources 15 and 17, the Ga beam source 14 and the Al beam source 16 were used to effect the epitaxial growth of a multilayer of GaAs-Ga$_{1-x}$Al$_x$As. During the epitaxial growth, the shutters of the Ga beam source 14 and the As beam sources 15 and 17 were kept opened while the shutter of the Al beam source was intermittently opened and closed in order to epitaxially grow the multilayer consisting of GaAs layers and Ga$_{1-x}$Al$_x$As layers. FIG. 11(b) shows diagrammatically a (011) cross section of the substrate or specimen after five layers had been formed with the Ga, Al and As$_4$ beams indicated by arrows 55, 56 and 57, respectively. When the layers 50, 52 and 54 were being grown, the shutter of the Al beam source 16 was kept closed so that these layers 50, 52 and 54 are GaAs layers. When the layers 51 and 53 were being grown, the shutter of the Al beam source 16 was kept opened so that these two layers are Ga$_{1-x}$Al$_x$As layers. Hot phosphoric acid is an etchant which cannot attach the GaAs layers but attacks the Ga$_{1-x}$Al$_x$As layers at a high etching rate which is increased as the concentration of Al(x) is increased. The cross-hatched area in FIG. 11(b) is a region where the Al concentration is high.

Figure 12A:
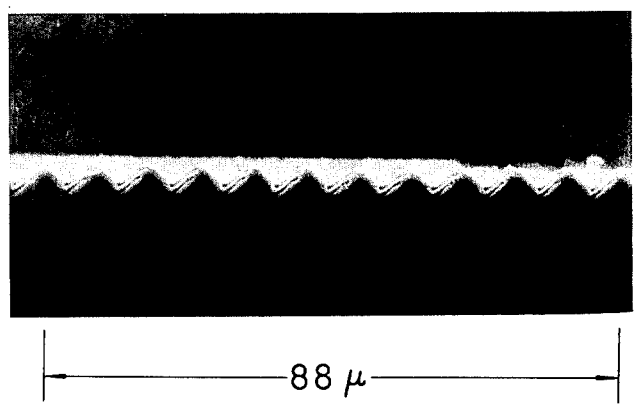
FIGS. 12(a) and (b) show scanning electron microscopic photos of selectively etched cleavage faces of the fourth embodiment.
Figure 12B:

FIG. 12 shows scanning type electron microscopic photos of a specimen with the (011) cleavage face which was immersed in hot phosphoric acid at 100° for three minutes in order to selectively etch the high Al concentration regions in Ga$_{1-x}$Al$_x$As layers. FIG. 12(a) is a photo at a low magnification showing valleys a pitch of 8 microns in length between one ridge and next one. Dark areas correspond to the regions with high Al concentrations. Because of the selective or preferential etching the etched regions are in the form of cavities which correspond to the cross-hatched areas in the layers 51 and 53 shown in FIG. 11(b). The photo of FIG. 12(b) shows on an enlarged scale a local area of a multilayer film formed on valleys and ridges with a pitch of 16 microns. It is seen that etched depth is smoothly changed, which shows that the composition x in the Ga$_{1-x}$Al$_x$As layer is varied smoothly depending upon the arrival rates of Ga and Al beams.

The inventors had not investigated in detail the dependence of the Al concentration x on positions, but the concentration distribution as well as the film thickness may be easily analized based not only the fact that the sticking coefficient of Ga and Al are substantially equal to unity but also the results obtained from Examples 1 and 3. Referring back to FIG. 11(b), a vertical line n is erected at a point p arbitarily selected in the interface between the Ga$_{1-x}$Al$_x$As layer 51 and the GaAs layer 50 below: Angles between the vertical line n and the directions of incident Ga and Al beams 56 and 57 are designated by $\phi_{Ga}$ and $\phi_{Al}$, respectively, and the arrival rates of Ga and Al beams with $\phi_{Ga}=0$ and $\phi_{Al}=0$ are denoted by I$_{Ga}$ and I$_{Al}$, respectively. Then the concentration Xp and thickness of the later 51 at the point p are given by $$X_p = \frac{I_{Al} \cdot \cos \phi_{Al}}{I_{Ga} \cdot \cos \phi_{Ga} + I_{Al} \cdot \cos \phi_{Al}}$$

$$D_Q = C \cdot (I_{Ga} \cdot \cos \phi_{Ga} + I_{Al} \cdot \cos \phi_{Al})$$

where C = a constant of proportionality.

In like manner, the concentration Xp and the thickness D$_Q$ may be obtained at various points because the profile of the mesa shaped structure as well as the directions of incidence of beams are known. The characteristics of the depth D$_Q$ are clearly indicated by the thickness of the cavities in the Ga$_{1-x}$Al$_x$As layers which were selectively etched as shown in FIGS. 12(a) and 12(b) and by the variation in thickness of the GaAs layer remaining between these cavities. In addition the variation in depth of cavities shown in FIG. 12(b) clearly and qualitatively indicates the dependence of the concentration X on positions.

EXAMPLE 5

Following the procedures of Example 4, the epitaxial growth of a multilayer consisting of $Ga_{1-x}Al_xAs$ and GaAs layers was effected. A substrate was placed on the substrate holder with the <011> direction in parallel with x-axis (See FIG. 3), and with the Ga beam source 14 and As beam sources 15 and 17, a GaAs layer was grown first. Thereafter, the shutter of the Al beam source which had been preheated was opened to grow a $Ga_{1-x}Al_xAs$ layer. Then the substrate holder was rotated through 90° so that the <011> direction of the substrate was in parallel with the y-axis (See FIG. 3), and thereafter layer of $Ga_{1-x}Al_xAs$ was grown. After the $Ga_{1-x}Al_xAs$ layer had been grown to a predetermined thickness, the substrate holder was rotated through 180° so that the direction <011> was in parallel with the −y direction and a layer was grown. These steps were cycled to form a multilayer of $Ga_{1-x}Al_xAs$. Thereafter the direction <011> of the substrate was made in parallel with the x-axis again, and a layer of $Ga_{1-x}Al_xAs$ was grown, and the shutter of the Al beam source was closed so that the last layer of GaAs was grown. During the epitaxial growth, all of the beam sources were so controlled that the As rich condition was maintained. The specimen was cut along (011) and was subjected to etching so that the structure of multilayer was clearly seen. The specimen was further subjected to selective etching with hot phosphoric acid so that cavities were observed as shown in FIG. 12. This shows that the arrival rates of Al and Ga beams varied depending upon the orientation of the substrate.

Example 5 teaches that the arrival rates of beams of molecules at an arbitarily selected point on a crystal growth surface may be varied by changing the relative position of the substrate with respect to the beam sources.

EXAMPLE 6

Figure 13:
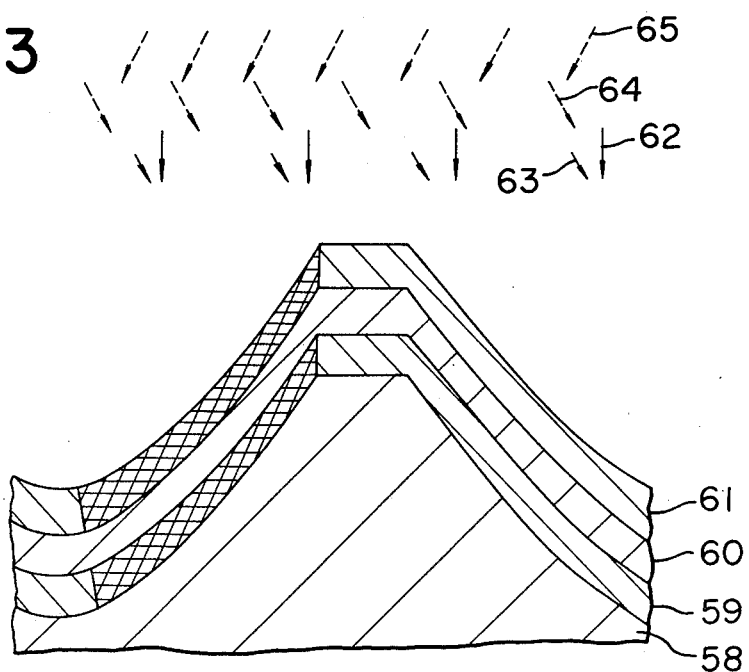
FIGS. 13, 14 and 15 are schematic views of sixth, seventh and eighth embodiments of the present invention, respectively.

Following the procedures of Example 4, a substrate was prepared and placed on the substrate holder with the <011> direction oriented in parallel with the x-axis. The beam source containing GaP was located at 15 (See FIG. 3), and with the Ga beam source 14 and the As beam source 17 the epitaxial growth was effected. FIG. 13 shows schematically a (011) cross section and the directions of incident beams 62, 63, 64 and 65. The beams 62 and 63 are Ga beams from the Ga beam source 14 and the GaP beam source 15, respectively; the beam 64 is $P_2$ beam from the GaP source; and the beams 65, $As_4$ beam from the As beam source 17. The shutter of the GaP source 15 was kept closed only when a layer 60 was grown. After three layers 59, 60 and 61 had been grown, the specimen was cut along the face (011) and was subjected to etching with A-B etchant at room temperature. This etchant etches GaAs at a higher rate, but the etching rate is decreased as the concentration y of P in $GaAs_{1-y}P_y$ is increased. The inventors observed the etched face through a scanning type electron microscope and found out that the regions of high P concentrations (cross-hatched areas in FIG. 13) were left unetched.

Opposed to the mixed crystals of atoms in Group III such as $Ga_{1-x}Al_xAs$ described in Examples 4 and 5, the concentration y of a mixed crystal $GaAs_{1-y}P_y$ including the atoms in the Group V: cannot be simply determined by the arrival rates of $As_4$ and $P_2$ beams, but the experimental results show that the region at which the arrival rate of $P_2$ beam is high has a higher concentration y.

So far the selective epitaxial growth of GaAs and its mixed crystals has been described. As described in Example 1, the surface diffusion length of Ga can be made extremely shorter than 200 Å. The surface diffusion length varies depending upon the conditions for crystal growth, but as far as the diffusion length is smaller as compared with the size of the self-masking structures it is possible to selectively grow crystals having the compositions depending upon the local arrival rates of molecular beams.

The present invention may be equally applied to the doping of impurities into crystals. Since the behaviors of impurities on the surface of grown crystal layer are different from one impurity to another, the following precautions must be taken.

(a) Impurities having a sticking coefficient substantially equal to unity are Si and Sn which are donors, Mn and Be which are acceptors and Ge which is amphoteric. These donors and acceptors may be doped selectively by the method in accordance with the present invention, and the concentrations of dopants may be determined as a function of local arrival rates of dopant beams as described in detail in Example 4. However with impurities such as Sn which has a high segregation coefficient and tends to move considerably during crystal growth of for instance GaAs, it must be taken into consideration that a doping profile tends to become larger, but when the distance the impurity moves is shorter as compared with the size of multi-dimensional structures, the movement of the impurity may be negligible.

Ge which is an ampho ion is known as serving as a donor under As rich condition or as an acceptor under Ga rich condition. The prior art methods have the defect that when GaAs is grown on a flat surface under Ga rich condition, Ga liquid drops tend to be formed. However, as described in detail in Example 1, according to the present invention no Ga liquid drop will be formed even under Ga rich condition when the Ga rich region is small. Therefore it follows that when the profile of a structure is so selected that locally Ga and As rich regions may be formed and Ge is doped, Ge serves as a donor in the As rich region while serving as an acceptor in the Ga rich region.

(b) Mg is an acceptor whose sticking coefficient is greatly dependent upon the composition of crystals. For instance the sticking coefficient of Mg to $Ga_{1-x}Al_xAs$ is about $1 \times 10^{-5}$ when x=0, and about $7 \times 10^{-3}$ when x=0.2. Therefore even when the angle of an incident beam of Mg molecules is not strictly controlled, Mg is automatically selectively doped into high Al concentration regions.

(c) It is well known in the art that when an impurity is ionized and doped, its sticking coefficient is considerably increased even though its sticking coefficient is very small when the impurity is in the form of a neutralized atom or molecule. Therefore when the direction of incident beam of such impurity ions is controlled, the selective doping is possible.

Next some examples of doping will be described.

EXAMPLE 7

Figure 14:
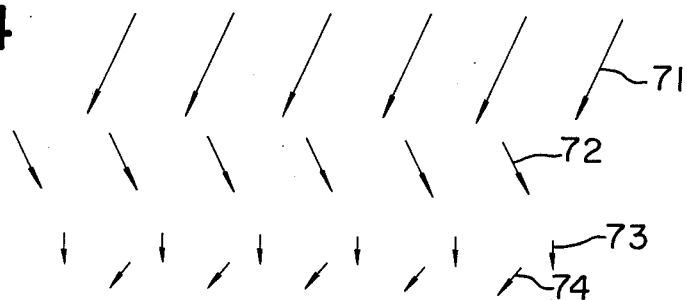
Figure 14:
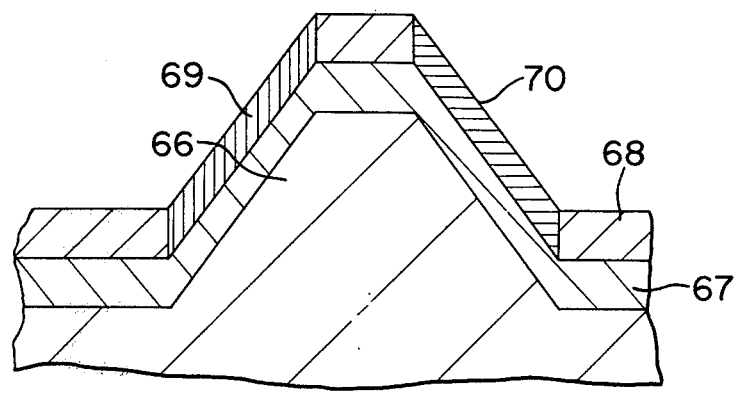

Referring back to FIG. 3, As beam sources were located at 15 and 17; a p-type dopant or Mg beam source, at 18; and an n-type dopant or Sn beam source was at 19 in the x–z plane and inclined at 35° relative to z-axis. The temperatures of these beam sources 15, 17, 18 and 19 were so determined that an epitaxial layer of $Ga_{1-x}Al_xAs$ grown on a flat substrate has $x=0.2$, As rich condition was maintained during epitaxial growth, Sn concentration $3\times10^{18}/cm^3$ was obtained when the Sn beam source 19 was energized, and the hole concentration of $1\times10^{18}/cm^3$ was attained when the Mg beam source 18 was energized. Following the procedures of Example 4, the substrate was formed with alternate ridges and valleys with a pitch of 200 microns, and placed on the substrate holder with the (011) direction oriented in parallel with the x-axis. With the Ga beam source 14, the As beam source 15 and 17 and the Sn beam source 19, first an n-type GaAs buffer layer was grown. Thereafter the substrate was rotated so that the <011> direction was in parallel with the y-axis, and the shutters of the Al beam source which had been preheated to a predetermined temperature, and of the Mg beam source 18 which had been preheated to 300° C. were opened while the Mg beam source 18 was immediately heated to a predetermined Mg beam emission temperature. A $Ga_{1-x}Al_xAs$ layer doped with Sn and Mg was grown to a predetermined thickness. Thus obtained specimen was subjected to heat-treating in the As atmosphere, and cut along the (011) face. FIG. 14 schematically shows a (011) cross section of the specimen. A layer 67 formed on a structure 66 is a Sn-doped GaAs layer, and a layer 68 is a Sn- and Mg-doped $Ga_{1-x}Al_xAs$ layer. The arrows indicate the direction of incident beams during the growth of the layer 68, and 71, 72, 73 and 74 are Ga, Al, Mg and Sn beams, respectively. ($As_4$ beam is not shown).

The inventors tested the conductivity by probing and carefully observed the stain etched and selectively etched cleavage faces. As a result, we found out:
(a) a region 69 in the layer 68 had a high Al concentration and was p-type;
(b) a region 70 had an especially low Al concentration and was n-type; and
(c) the remaining region was of n-type.

The inventors interpreted these findings as follows:
(I) The variation in Al concentration is similar to that described in Example 4;
(II) Only the region 69 had a high A concentration and was of p-type. This is due to the dependence of sticking coefficient S of Mg on the composition of $Ga_{1-x}Al_xAs$. That is, when $x=0$, $S=10^{-5}$, but when $X=0.2$, the sticking coefficient S suddenly increases as high as $7\times10^{-3}$; and
(III) The remaining region was of n-type. This is due the distribution of local arrival rates of the Sn beam and the decrease in sticking coefficient of Mg accompanied by the relative decrease in Al concentration.

EXAMPLE 8

The Ga and Sn beam sources were located at 18 and 19, respectively, and a Zn beam source was located at 20 in the x-z plane and inclined at 35° relative to the z-axis. Following the procedures of Example 7, an n-type GaAs substrate with a (011) major surface was formed with alternate ridges and valleys with a pitch of 200 microns, and placed on the substrate holder with the direction <011> oriented in parallel with the y-axis. With the As beam source 15 and 17, the Ga beam source 18, the Sn beam source 19 and the Zn beam source 20, a Sn- and Zn-doped GaAs layer was grown. The temperatures of these beam sources were so controlled that the doping concentrations of Sn and Zn in the GaAs epitaxial layer grown on the (100) major surface of the GaAs substrate were $3\times10^{18}/cm^3$ and $1\times10^{18}/cm^3$, respectively. The acceleration voltage of $Zn^+$ ions was 1,000 V.

Figure 15:
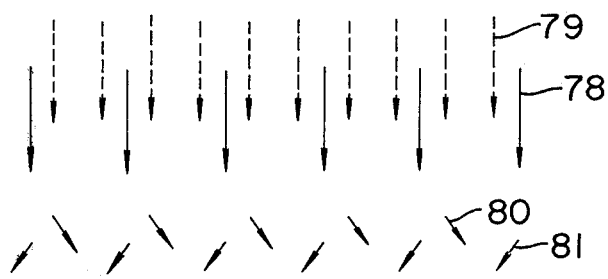
Figure 15:
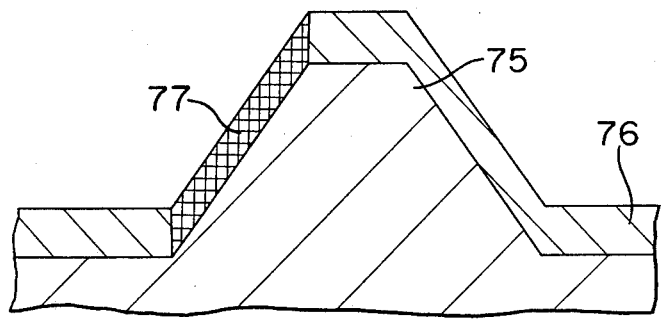

FIG. 15 is a (011) cross section of thus obtained specimen, and arrows 78, 79, 80 and 81 indicate the Ga, $As_4$, $Zn^+$ and Sn beams. Following the procedures of Example 7, the inventors found out that only a region 77 in an epitaxial layer 75 formed on a structure 75 was of p-type while the remaining region, of n-type.

EXAMPLE 9

Figure 16A:
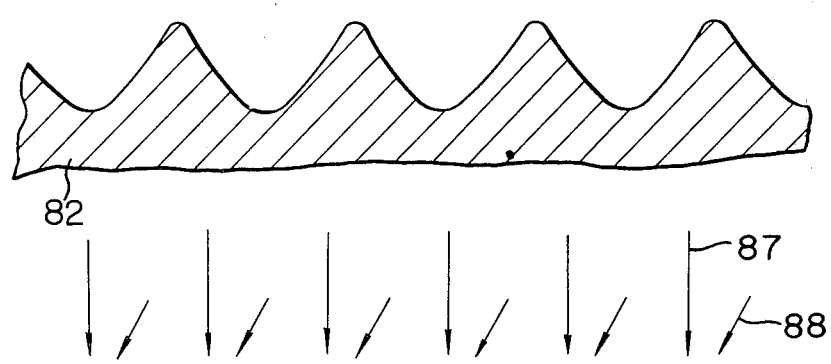
FIGS. 16(a) and (b) are views used for the explanation of the fabrication steps of a ninth embodiment of the present invention.

The $As_4$ beam sources were located at 15 and 17, and Ga, Al, Si and Mn beam sources were located at 18, 16, 19 and 20, respectively. Photoresist Az-1350J was applied to the (100) major surface of a Si-doped, n-type GaAs substrate, and holography with an Ar ion laser was employed to project an interference fringe pattern with parallel fringes spaced apart by 3,700 Å and oriented in parallel with the <011> direction of the substrate within a tolerance of ±1'. Thereafter the substrate was etched with the etchant described in Example 1 so that ridges and valleys were left on the (011) major surface of the substrate 82 as shown in FIG. 16(a). The substrate 82 was placed on the substrate holder with the <011> direction oriented in parallel with the y-axis (See FIG. 3). Following the example 1, a $Ga_{1-x}Al_xAs$ layer 83 selectively doped with Si and Mn was grown to a thickness of about 0.2 μm, and thereafter a $Ga_{1-x}Al_xAs$ layer 86 was grown and doped with Si only. The total thickness of the layers 83 and 86 was about 1.5 μm. During the epitaxial process, the ratio of intensity between the Ga and Al beams was maintained 3:1 while the intensities of the Si and Mn beams were so controlled that their concentration was $2\times10^{18}/cm^3$ and $1\times10^{18}/cm^3$, respectively.

Figure 16B:
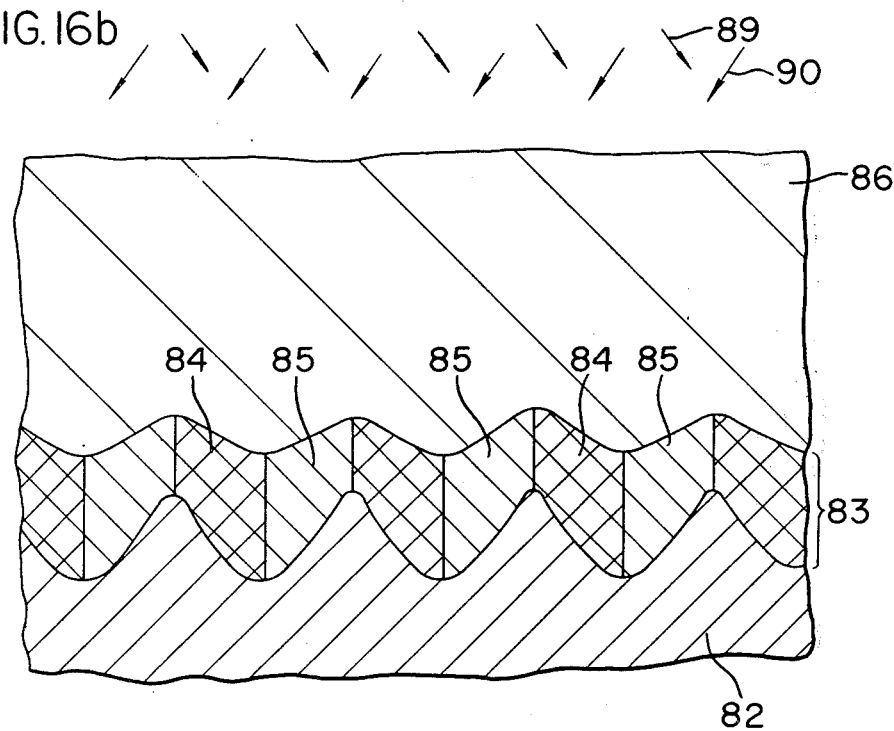

FIG. 16(b) schematically depicts the structure of the epitaxial layer, and the arrows 87, 88, 89 and 90 indicate the Ga, Al, Si and Mn beams (As beams are not shown). The inventors carefully observed through a scanning type electron microscope the (011) cleavage face which was subjected to selective and stain etchings, and found out
(I) The Al concentration was higher in a region 84 than in a region 85;
(II) As the average thickness $D_{av}$ of the epitaxial layer approaches to the pitch or spacing (3,700 Å) of the ridges and valleys on the substrate, the surface roughness of the epitaxial layer becomes smoother and the variation in Al concentration decreases;
(III) When the average thickness of the epitaxial layers 83 and 86 is sufficiently increased relative to the pitch or spacing of the ridges and valleys of the substrate, the surface of the layer 86 becomes smoother and the Al concentration in the $Ga_{1-x}Al_xAs$ layer is averaged; and
(IV) The measurement of the conductivity at regions 84 and 85 was extremely difficult because these regions were extremely small. The donor impurity or Si used in this Example exhibits less segregation effect so that it is assumed that the concentration in these small regions is also dependent upon the variation in local arrival rate of the beams.

As described above, according to the present invention an epitaxial layer having a very fine and three-dimensional structure hitherto unattainable by the prior art can be grown. The present invention capable of growing an epitaxial layer having an especially fine and multi-dimensional structure will be very effective for improving various existing semiconductor devices and fabricating novel semiconductor devices which would be newly invented.

The present invention is based on the following observed facts:

(I) The epitaxial molecular beams travel a straight path;

(II) The local arrival rate of a uniformly emitted epitaxial molecular beam may be varied by forming a structure having a suitable geometrical configuration upon a substrate; and (III) The surface diffusion length of an atom or molecule sticked to the surface of a grown crystal layer may be controlled and can be made extremely shorter (less than 200 Å) by suitably controlling the conditions of the molecular beam epitaxial process.

So far the present invention has been described only in conjunction with the semiconductors in Groups III and V such as GaAs, $Ga_{1-x}Al_xAs$ and $GaAs_{1-y}P_y$, but it is to be understood that the present invention is not limited thereto and that the present invention may be equally used for epitaxially growing crystals of semiconductors in other Groups and Non-semiconductors such as dielectric and magnetic substances. Furthermore, the present invention is not limited to the molecular beam epitaxy in a narrow sense, and may be applied to any crystal growing methods which may satisfy the condition that the mean free path (l) of molecules is greater than a source-to-substrate distance (L).

Examples 1 through 9 have disclosed the crystals having novel structures, and some modifications of the crystal growing method in accordance with the present invention, some applications to the semiconductor devices and novel semiconductors which are now feasible by the present invention and which those skilled in the art would be aware of from the present invention will be described.

(I) Those pertaining to Example 1:

(a) Applications: Formation of separated layers, self-aligning or registering, selective epitaxial growth and so on.

(b) Modifications: An etching mask of $SiO_2$ or $Si_3N_4$ is left unstripped after etching, and an epitaxial layer is grown on the left etching mask so that the selective epitaxy utilizing undercuts left after etching may be effected.

(c) Novel semiconductor devices: The present invention discloses the very fundamental crystal growing method so that various semiconductor devices would be invented based on the present invention. The self-alignment or registration attainable by the present invention would be widely used such as in the fabrication of field-effect transistors (See FIG. 8).

(II) Those pertaining to other Examples:

(a) Applications: Fabrication of various semiconductor and single crystal devices wherein the properties of a single crystal layer or film having a self-registering, three-dimensional structure are utilized.

(b) Modifications:

(b-1): Modifications of means forming on a single crystal substrate a three-dimensional structure having a geometrical configuration; For instance, a three-dimensional structure may have a multi-dimensional period. Instead of forming a three-dimensional structure by etching, it may be formed by the selective epitaxial growth.

(b-2): Modifications of the angle of incidence of molecular beam and the relative position between a substrate and beams sources. The beam sources may be increased or decreased in number.

(c) Novel semiconductor devices: A multilayer may be grown in a very simple manner so that a thin mixed crystal film having a multi-dimensional structure may be grown. Furthermore, a p- or n-type region may be selectively formed so that the present invention may be applied to (i) the fabrication of embedded hetero optical transmission pathes in the field of semiconductor devices and (ii) the fabrication of light emitting devices, optical modulators, optical branching devices, optical amplifiers and so on as the applications of the hetero optical transmission pathes. The novel semiconductor device described in Example 8 and shown in FIG. 16 is an asymmetrical Bragg's reflector device, and when it is incorporated in a distribution-feedback type laser, both or either of the refraction index feedback or the emission feedback may be effected. Thus, the asymmetrical structure may be very advantageously utilized. In addition, when this asymmetrical structure is used as a grating, novel devices hitherto unknown will be obtained.

Having described our invention as related to the embodiment shown in the accompanying drawing, it is our invention that the present invention be not limited by any of the details of description, unless otherwise specified, but rather be constructed broadly within its spirit and scope as set out in the accompanying drawings.

What is claimed is:

1. A method for manufacturing single crystal devices by molecular beams by epitaxially growing of new crystal layers over a crystal substrate which comprises:
   (a) forming on one major surface of said substrate a three dimensional structure having a suitable geometrical configuration;
   (b) maintaining the substrate at a predetermined temperature; and
   (c) impinging at least one molecular beam for forming said crystal layer on said substrate at an oblique angle relative to the major surface of said substrate, at a reduced pressure at which the mean path of said molecules in said molecular beam is greater than the distance between the molecular beam source and said substrate, whereby said epitaxially grown crystal layer is grown on local regions of said major surface of said crystal substrate dependent upon the arrival rates of said molecular beams.

2. A method as set forth in claim 1, wherein the smallest thickness of said epitaxial crystal layer is smaller than the smallest dimension forming said three dimensional structure.

3. A method as set forth in claim 1, wherein said molecular beams have a molecular beam of a first Group element, the sticking coefficient of which is unity and a molecular beam of a second Group element which sticks on the surface of said substrate by reacting on said first Group element.

4. A method as set forth in claim 3, wherein in a region on said substrate wherein the arrival rate of the molecular beam of the first Group element changes, a local region of the crystal layer having a thickness proportioned to said arrival rate is formed.

5. A method as set forth in claim 3, wherein in the three dimensional structure, a local region, in which the arrival rate of the molecular beam of said second Group element is smaller than that of the molecular beam of said second Group element in said one major surface of said substrate, is formed on the substrate and the thickness of said crystal layer in said local region is thinner than that of the arrival rate of the molecular beam of said first Group element.

6. A method as set forth in claim 3, wherein in the three dimensional structure, a region, in which the arrival rate of the molecular beam of said second Group elements is smaller than that of the molecular beam of said second Group elements in said one major surface of said substrate, is formed on the substrate and the thickness of said crystal layer in the neighborhood of said area is thicker than that of the arrival rate of the molecular beam of said first Group element.

7. A method as set forth in claim 3, wherein a plurality of kinds of elements are used as a molecular beam of the first Group element.

8. A method as set forth in claim 3, wherein a plurality of molecular beams are used as a molecular beam of said second Group element.

9. A method as set forth in claim 1, wherein the surface diffusion length of at least one type material molecules impinged on the surface of the grown crystal layer is smaller as compared with the size of said three dimensional structures.

10. A method as set forth in claim 1, wherein said epitaxially grown crystal layer consists of a semiconductor compound consisting of atoms in Groups III and V.

11. A method as set forth in claim 1, wherein a plurality of material molecule supply sources are used depending upon types of atoms constituting a desired mixed crystal, and the arrival rates of said molecular beams are varied from one point to another depending upon the local incident angle of the molecular beams, whereby local regions having different compositions of the mixed crystal are formed dependent upon said local arrival rates of said molecular beams.

12. A method as set forth in claim 11, wherein said epitaxially grown crystal layer consists of $Ga_{1-x}Al_xAs$.

13. A method as set forth in claim 1, wherein in addition to said material molecule supply sources, at least one supply source for emitting a beam of a desired impurity is provided so that regions wherein different types of local impurities or concentrations thereof are formed.

14. A method as set forth in claim 1, wherein the angle of incidence of said molecular beams is varied by changing the relative orientation of said major surface and said molecular beam sources.

15. A method as set forth in claim 1, wherein said method is a molecular beam epitaxy method.

16. A method for manufacturing single crystal devices by molecular beam epitaxially growing of new crystal layers over a crystal substrate which comprises:
  (a) forming on one major surface of said substrate a three dimensional structure having a suitable geometrical configuration;
  (b) maintaining the substrate at a predetermined temperature; and
  (c) impinging at least one molecular beam for forming said crystal layer on said substrate at an oblique angle relative to the major surface of said substrate, at a reduced pressure at which the mean free path of said molecules in said molecular beam is greater than the distance between the molecular beam source and said substrate, whereby said epitaxially grown crystal layer is grown on local regions of said major surface of said crystal substrate and is separated self-alignignly dependent upon the local arrival rate of said molecular beams due to self-masking of said three dimensional structures.

17. A method as set forth in claim 16, wherein the angle of incidence of said molecular beams is varied by changing the relative orientation of said major surface and said molecular beam sources.

18. A method as set forth in claim 16, wherein said method is a molecular beam epitaxy method.

19. A method as set forth in claim 16 wherein the surface diffusion length of at least one type of material molecules impinged on the surface of the grown crystal layer is shorter as compared with the size of said three-dimensional structures.

20. A method as set forth in claim 16 wherein said three-dimensional structures are formed by the preferential etching of said crystal substrate.

21. A method as set forth in claim 16 wherein said epitaxially grown crystal layer consists of a semiconductor compound consisting of atoms in Groups III and V.

22. A method as set forth in claim 21 wherein said epitaxially grown crystal layer consists of $Ga_{1-x}Al_xAs$ ($0 \leq x \leq 1$) or $GaAs_{1-y}P_y$ ($0 \leq y \leq 1$).

23. A method as set forth in claim 16 wherein a plurality of material molecule supply sources are used depending upon types of atoms constituting a desired mixed crystal, and the arrival rates of said molecular beams are varied from one point to another depending upon the local incident angle of the molecular beams, whereby local regions having different compositions of the mixed crystal are formed dependent upon said arrival rates of said molecular beams.

24. A method as set forth in claim 16 wherein in addition to said material molecule supply sources, at least one supply source for emitting a beam of a desired impurity is provided so that regions wherein different types of local impurities or concentrations thereof are formed.

25. A method as set forth in claim 16 wherein said three-dimensional structures are periodically arranged on said crystal substrate.

26. A method as set forth in claim 16 further comprising varying the angle of incidence of said material molecules relative to said crystal substrate.

* * * * *

UNITED STATES PATENT AND TRADEMARK OFFICE
CERTIFICATE OF CORRECTION

PATENT NO. : 4,171,234
DATED : October 16, 1979
INVENTOR(S) : Seiichi Nagata, et al It is certified that error appears in the above—identified patent and that said Letters Patent is hereby corrected as shown below:

Column 1, line 63: "this" should be --the--.

Column 2, line 29: "structure" should be --structures--.

Column 3, line 30: "principles" should be --principle--.

Column 4, line 13: "9" should be --10--.

line 14: "10" should be --8--.

Column 11, line 51: "beams" should be --beam--.

Column 13, line 13: "source" (2nd occurrence) should be --sources--.

line 64: "source" should be --sources--.

Column 16, line 25: "invention" (1st occurrence) should be --intention--.

Signed and Sealed this

Twenty-seventh Day of May 1980

[SEAL]

Attest:

SIDNEY A. DIAMOND

Attesting Officer    Commissioner of Patents and Trademarks